United States Patent
Yarborough, Jr.

(10) Patent No.: US 7,227,422 B2
(45) Date of Patent: Jun. 5, 2007

(54) TEMPERATURE COMPENSATED R-C OSCILLATOR

(75) Inventor: John M. Yarborough, Jr., Palo Alto, CA (US)

(73) Assignee: NXP B.V., Eindhoven (NL)

(*) Notice: Subject to any disclaimer, the term of this patent is extended or adjusted under 35 U.S.C. 154(b) by 70 days.

(21) Appl. No.: 10/538,574

(22) PCT Filed: Dec. 15, 2003

(86) PCT No.: PCT/IB03/05979

§ 371 (c)(1),
(2), (4) Date: Jun. 15, 2005

(87) PCT Pub. No.: WO2004/055968

PCT Pub. Date: Jul. 1, 2004

(65) Prior Publication Data

US 2006/0114073 A1    Jun. 1, 2006

Related U.S. Application Data

(60) Provisional application No. 60/434,113, filed on Dec. 17, 2002.

(51) Int. Cl.
*H03L 1/02* (2006.01)
*H03K 3/12* (2006.01)

(52) U.S. Cl. .................. 331/176; 331/113 R; 331/143

(58) Field of Classification Search ................ 331/111, 331/113 R, 143, 144, 176
See application file for complete search history.

(56) References Cited

U.S. PATENT DOCUMENTS

| 6,300,843 | B1 | 10/2001 | Kodama |
| 6,356,161 | B1* | 3/2002 | Nolan et al. ................. 331/176 |
| 6,888,763 | B1* | 5/2005 | Guo ........................ 365/189.11 |

* cited by examiner

*Primary Examiner*—Robert Pascal
*Assistant Examiner*—James Goodley
(74) *Attorney, Agent, or Firm*—Peter Zawilski

(57) ABSTRACT

An R-C oscillator (200) is configured to vary the two voltage levels that are used to control the oscillation, such that the variation in oscillation frequency with temperature is minimized. A first resistor (R1) is used to control one of the voltage levels, and a second resistor (R2) having a temperature coefficient that differs from the temperature coefficient of the first transistor is used to control the other voltage level. The first resistor (R1) also controls the current used to charge and discharge the capacitor (C) used to effect the oscillation. By the appropriate choice of resistance values, the variations of the control voltages and current are such that the time to charge and discharge the capacitor (C) between the control voltages remains substantially constant with temperature. Preferably the resistance values are selected to also compensate for temperature variations in the delay of the feedback loop.

18 Claims, 1 Drawing Sheet

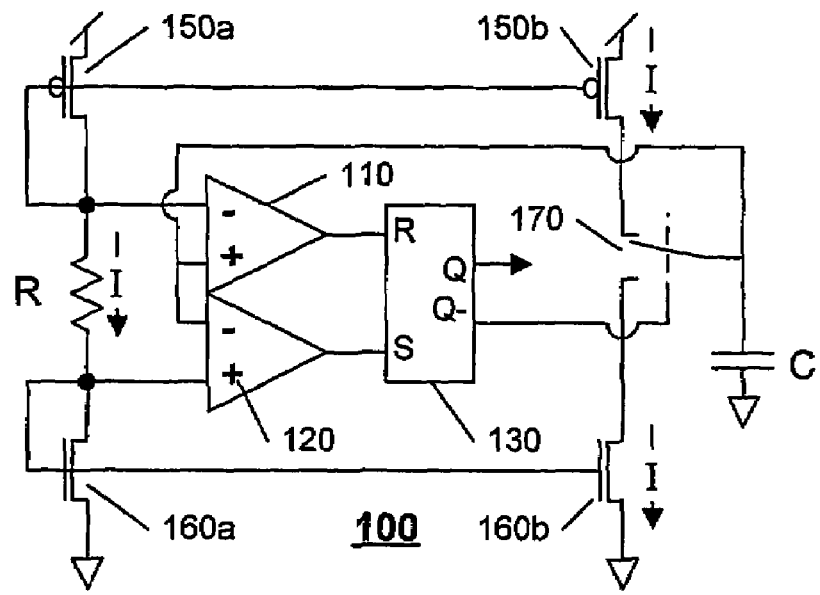
FIG. 1 [Prior Art]
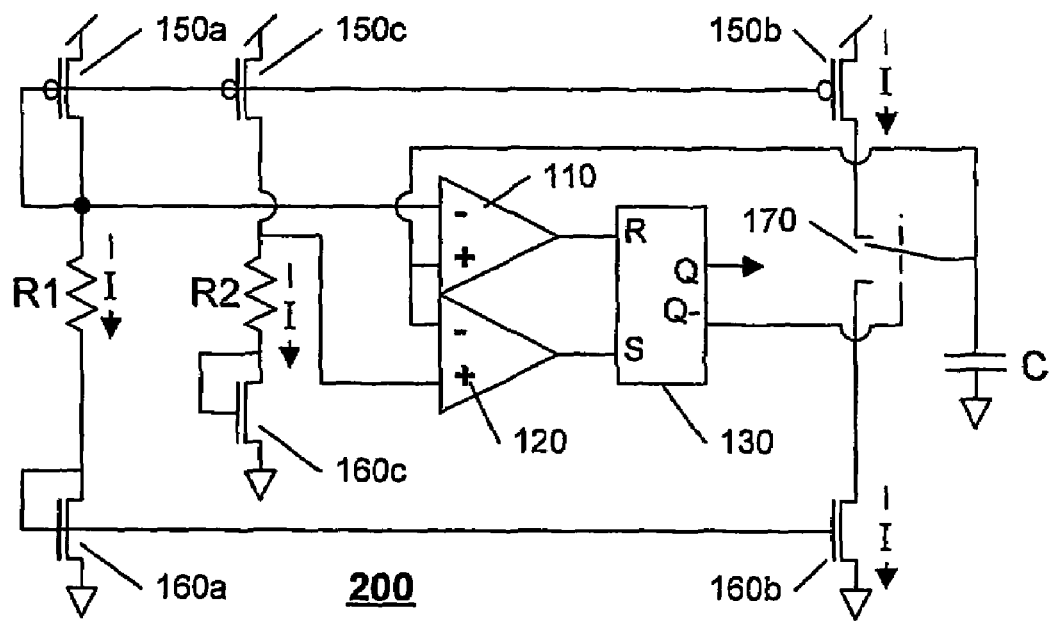
FIG. 2

TEMPERATURE COMPENSATED R-C OSCILLATOR

CROSS REFERENCE TO RELATED APPLICATION

This application claims the benefit of U.S. provisional application Ser. No. 60/434,113 filed Dec. 17, 2002, which is incorporated herein by reference.

This invention relates to the field of electronic circuit design, and in particular to a temperature compensated oscillator Conventional R-C (resistor-capacitor) oscillators operate by systematically charging and discharging a capacitor via a current that is controlled by a resistor. The voltage across the oscillator is fed back to a switching device that alternately charges and discharges the capacitor. When the voltage on the capacitor reaches an upper limit, the switching device initiates a discharge of the capacitor; when the voltage on the capacitor reaches a lower limit, the switching device initiates a charge of the capacitor. The rate of charge and discharge to and from the capacitor that produces the voltage swing between the upper and lower voltage limits is controlled by the current flow through a resistor.

FIG. 1 illustrates an example prior art circuit diagram of a conventional R-C oscillator 100. A first stage includes a resistor R that controls current flow through a pair of diode-configured transistors 150a, 150b. The voltages at opposing nodes of the resistor provide a pair of voltage levels that are used to control the alternating charge and discharge of a capacitor C.

A switching stage includes a pair of comparators 110, 120, a bistable device 130, a switch 170, and a pair of transistors 150b, 160b that provide the charge or discharge currents to the capacitor C, as detailed below.

Assume, initially, that the switch 170 is configured to couple the capacitor C to the charging transistor 150b, corresponding to a logic "0" at the Q-output of the bistable device 130. The comparator 110 compares the voltage on the capacitor C to the voltage level at the upper node of the resistor R. When the voltage level on the capacitor C increases to the voltage level at the upper node of resistor R, the bistable device 130 is reset, thereby asserting a logic "1" at the Q-output, which switches the coupling of the capacitor C to the discharging transistor 160b. Thereafter, when the voltage level on the capacitor C decreases below the voltage level at the lower node of resistor R, the comparator 120 asserts a set signal to the bistable device 130. The set signal produces a logic "0" at the Q-output, thereby switching the coupling of the capacitor C back to the charging transistor 150b.

When neither the set nor reset of the bistable device 130 is asserted, the bistable device 130 retains its prior output state. Thus, once the switch 170 is controlled to couple the capacitor to the particular charge/discharge transistor 150b/160b, the charging/discharging continues until the next reset/set signal is asserted. In this manner, the switching stage alternately charges and discharges the capacitor C between the first and second voltage levels on the upper and lower nodes of the resistor R, respectively. The rate of change of the voltage on the capacitor between the first and second voltage levels is controlled by the value of the resistor R, because the transistor pairs 150b, 160b are configured as current mirrors with the transistor pairs 150a, 160a.

Because the same current, I, is provided to charge and discharge the capacitor C, the oscillation will be symmetric, and the half-cycle time can be expressed as:

$$T_{1/2} = ((V_h - V_l) * C)/I, \quad (1)$$

where $V_h$ is the upper limit voltage of the node of the resistor R at the comparator 110, and $V_l$ is the lower limit voltage of the node of the resistor R at the comparator 120. However, $$(V_h - V_l) = R * I, \quad (2)$$

and thus $T_{1/2} = R * C. \quad (3)$

The operation of the prior art R-C oscillator 100 of FIG. 1 is particularly sensitive to temperature variations that affect the value of the resistor R. Although the value of the capacitor C is fairly constant with temperature, the value of the resistor R varies significantly with temperature. Assuming a typically positive temperature coefficient, as the operating temperature increases, the resistance of the resistor R increases, thereby increasing the half-cycle time, $T_{1/2}$, in equation (3), above. In most semiconductor processes, the temperature coefficients of all resistors are of the same sign, and thus it is generally not possible to employ a negative-coefficient resistor to counter the temperature-varying effects of a positive-coefficient resistor, and vice versa.

Further compounding the problem, there is an inherent delay in the feedback loop of the switching stage, and this delay also increases with temperature, further decreasing the oscillation frequency of the oscillator 100.

It is an object of this invention to provide an R-C oscillator with reduced temperature dependency. It is another object of this invention to provide an R-C oscillator with reduced temperature dependency in a CMOS-compatible form.

These objects, and others, are achieved by an R-C oscillator that is configured to vary the two voltage levels that are used to control the oscillation, such that the variation in oscillation frequency with temperature is minimized. A first resistor is used to control one of the voltage levels, and a second resistor having a temperature coefficient that differs from the temperature coefficient of the first transistor is used to control the other voltage level. The first resistor also controls the current used to charge and discharge the capacitor used to effect the oscillation. By the appropriate choice of resistance values, the variations of the control voltages and current are such that the time to charge and discharge the capacitor between the control voltages remains substantially constant with temperature. Preferably the resistance values are selected to also compensate for temperature variations in the delay of the feedback loop.

FIG. 1 illustrates an example circuit diagram of a prior art R-C oscillator.

FIG. 2 illustrates an example circuit diagram of a temperature-compensated R-C oscillator in accordance with this invention.

Throughout the drawings, the same reference numeral refers to the same element, or an element that performs substantially the same function.

This invention is based on the observation that in most semiconductor processes, although the temperature coefficients of all resistors are of equal sign, the value of the temperature coefficient of different resistor-types can differ by an order of magnitude or more, and this difference in temperature coefficient can be used to compensate for the temperature effects of changes in resistance values, as well as other temperature-dependent effects.

For ease of understanding, the invention is initially presented using a zero-delay paradigm, wherein the delay between a voltage change and the results of the effects of the voltage change is zero.

FIG. 2 illustrates an example circuit diagram of a temperature-compensated R-C oscillator 200 in accordance with this invention. The additional components of this example circuit 200, relative to the example circuit 100, are the transistor pair 150c, 160c and the resistor R2 in series with these transistors 150c, 160c. Preferably, each of the N-channel transistors 160a, 160b, and 160c are substantially identical, as are the Pchannel transistors 150a, 150b, and 150c, although one of ordinary skill in the art will recognize that different sized transistors could be used, with appropriate changes to the equations below.

The diode-configured Nchannel transistor 160c is configured similar to the transistor 160a, and the Pchannel transistor 150c is configured as a current mirror to the transistor 150a, so that equal currents flow through resistors R1 and R2, and this is the same value of current, I, that charges and discharges the capacitor C.

Repeating equation (1), for convenience:

$$T_{1/2}=((V_h-V_l)*C)/I. \quad (1)$$

In the circuit 200:

$$Vh=I*R1+Vn, \quad (4)$$

$$\text{and } Vl=I*R2+Vn, \quad (5)$$

$$\text{so that } Vh-Vl=I*(R1-R2), \quad (6)$$

$$\text{and } T_{1/2}=(R1-R2)*C. \quad (7)$$

where Vn is the reference voltage drop across a diode-connect Nchannel transistor 160a, 160c, and R1>R2. To maintain a constant oscillation cycle-time, the value (R1−R2) in this invention is configured to remain substantially constant, as detailed below.

As is known in the art, the temperature dependency of resistance with temperature can be expressed as:

$$R(T)=R(T')*(1+K*(T-T')), \quad (8)$$

where R(T) is the resistance at temperature T, R(T') is the resistance at a temperature T', and K is the temperature coefficient of the resistor R. This invention is based on the observation that, because R1 is larger than R2, a substantially constant resistance difference ($R_d$=R1−R2) may be provided by selecting a resistor R2 that has a higher temperature coefficient than R1. Defining K1 as the temperature coefficient of resistor R1 and K2 as the temperature coefficient of resistor R2, the temperature dependency of the difference term (R1−R2) in equation (7) is given by:

$$R_d(T)=R1(T')*(1+K1*(T-T'))-R2(T')*(1+K2*(T-T')), \quad (9)$$

where $R_d(T)$ is the difference resistance (R1−R2) at temperature T.

Because the difference resistance Rd should be constant across all temperatures, this constant can be defined at $R_d(T)$ and $R_d(T')$ as:

$$R_d=R_d(T)=R_d(T')=R1(T')-R2(T'). \quad (10)$$

Solving equations (9) and (10) for R2(T') and R1(T'):

$$R2(T')=Rd*(K1/(K2-K1)), \quad (11)$$

$$\text{and } R1(T')=Rd+R2(T'). \quad (12)$$

The material with which a resistor is formed generally determines the temperature coefficient K of the resistor, and the resistance at a given temperature T' is generally defined as the nominal resistance value at room temperature, and is defined by the dimensions of the resistance material. Thus, to achieve substantial temperature independence, a designer selects values of the capacitor C and the difference resistance Rd to achieve the desired oscillator frequency, then selects appropriate materials such that the temperature coefficient of the material that is used for resistor R2 (K2) is larger than the temperature coefficient of the material that is used for resistor R1 (K1), and solves for the nominal resistances of R2 and R1 using equations (11) and (12).

EXAMPLE

Consider the design of a CMOS oscillator having a desired oscillation frequency of 1 KHz, via the use of a 5 pF capacitor C and a difference resistance $R_d$ of 100,000 ohms. The temperature coefficient of an Nwell resistor is known to be higher than the temperature coefficient of a Ppoly resistor; thus, resistor R2 will be formed as an Nwell resistor, and resistor R1 will be formed as a Ppoly resistor. Using a typical value of K1 of 0.06%/° C. for Ppoly resistors and of K2 of 0.5%/° C. for Nwell resistors:

R2=100,000*(0.06/(0.50−0.06))=13,636 ohms, and

R1=100,000+13,635=113,636 ohms.

In the foregoing, the delay within the feedback loop (from the capacitor C, through the comparators 110, 120, the bistable device 130, and the switch 170, and back to the capacitor C) is assumed to be zero. If the delay, D, is not substantially zero, the half-cycle time can be expressed as:

$$T_{1/2}=D(T)+(R1(T)-R2(T))*C, \quad (13)$$

$$\text{where } D(T)=D(T')*(1+K_d*(T-T')). \quad (14)$$

Expressing the half-cycle time in terms of an equivalent resistance, $R_{eq}$ times the capacitance:

$$T_{1/2}=R_{eq}*C=(D(T)/C+R1(T)-R2(T))*C, \quad (15)$$

$$\text{and, at } T', T_{1/2}=(D(T')/C+R1(T')-R2(T'))*C. \quad (16)$$

Solving equations 15 and 16 for R1(T') and R2(T'):

$$R2(T')=((D(T')/C)*(K_d-K1)+R_{eq}*K1)/(K2-K1), \quad (17)$$

$$\text{and } R1(T')=R_{eq}+R2(T'). \quad (18)$$

Note that the value of $K_d$ is a function of the process parameters, which, in general, exhibit a variance. A nominal value of $K_d$ can be used in the above equations 17, 18 to compensate for temperature variations under generally typical conditions. If more precise temperature compensation is desired, one or both of the resistors R1 and R2, are embodied as "trimmable" resistors. When the actual delay D(T') at the reference temperature T' (typically, room temperature, 20° C.) and the actual temperature $K_d$ are determined, based on the fabrication of the oscillator, the above equations (17) and (18) are used to trim the one or both resistors R1, R2 to effect the appropriate compensation.

The foregoing merely illustrates the principles of the invention. It will thus be appreciated that those skilled in the art will be able to devise various arrangements which, although not explicitly described or shown herein, embody the principles of the invention and are thus within the spirit and scope of the following claims.

What is claimed is:

1. An oscillator comprising: a first resistor (R1), a second resistor (R2), and a capacitor, wherein an oscillation frequency of the oscillator is dependent upon a difference between a first resistance value of the first resistor (R1) and a second resistance value of the second resistor (R2), the first resistance value being larger than the second resistance value, the first resistor (R1) exhibits a first rate of change with temperature, and the second resistor (R2) exhibits a second rate of change with temperature that is larger than the first rate of change, thereby allowing temperature-induced changes to the first resistance value to be offset by changes to the second resistance value, and thereby reducing variations in the oscillation frequency with temperature.

2. An oscillator as claimed in claim 1, comprising: a first stage, operably coupled to the first resistor (R1), that is configured to provide a first voltage level, based on the first resistance value, a second stage, operably coupled to the second resistor (R2), that is configured to provide a second voltage level, based on the second resistance value, and a switching stage, operably coupled to the first stage, the second stage, and the capacitor, and is configured to: decrease a voltage on the capacitor when the voltage increases to the first voltage level, increase the voltage on the capacitor when the voltage decreases to the second voltage level.

3. The oscillator of claim 2, wherein the first resistor (R1) substantially controls current flows through the first stage, the second stage, and the capacitor.

4. The oscillator of claim 3, wherein the current flows through the first stage, the second stage, and the capacitor are substantially equal in magnitude.

5. The oscillator of claim 4, wherein the second resistance value is selected based on the first resistance value, the first rate of change, and the second rate of change.

6. The oscillator of claim 5, wherein the second resistance value is selected based also on a delay associated with a feedback loop of the oscillator.

7. The oscillator of claim 5, wherein a value of the second resistance value at a base temperature includes a factor of $R_d*(K1/(K2-K1))$, and a value of the first resistance value at the base temperature is substantially equal to $R_d$ plus the value of the second resistance value at the base temperature, where $R_d$ corresponds to the difference between the first resistance value and the second resistance value at a base temperature, K1 is the first rate of change, and K2 is the second rate of change.

8. The oscillator of claim 7, wherein the value of the second resistance value at the base temperature further includes a second factor of $(D/C)*((Kd-K1)/(K2-K1))$, where D is a delay associated with a feedback loop of the oscillator at the base temperature, C is a capacitance value of the capacitor, and Kd is a rate of change of the delay with temperature.

9. The oscillator of claim 1, wherein the first resistor (R1) is formed as a Ppoly resistor of a CMOS device, and the second resistor (R2) is formed as an Nwell resistor of the CMOS device.

10. An oscillator comprising: a first stage that includes: a diode-configured Pchannel device operably coupled to a first voltage source, a diode-configured Nchannel device operably coupled to a second voltage source, and a first resistor (R1) operably coupled in series between the diode-configured P-channel and Nchannel devices, a first voltage level being provided at a first node that couples the first resistor (R1) to the diode-configured Pchannel device, a second stage that includes a Pchannel device operably coupled to the first voltage source and having a gate that is common to the first node, a diode-connected Nchannel device operably coupled to the second voltage source, and a second resistor (R2) operably coupled in series between the Pchannel device and the diode-configured Nchannel device of the second stage, a second voltage level being provided at a second node that couples the second resistor (R2) to the P-channel device; a switching stage that is configured to control a voltage on a capacitor such that: the voltage is decreased when the voltage increases to the first voltage level, and the voltage is increased when the voltage decreases to the second voltage level.

11. The oscillator of claim 10, wherein the first resistor (R1) has a first temperature coefficient, and the second resistor (R2) has a second temperature coefficient that is substantially larger than the first temperature coefficient.

12. The oscillator of claim 11, wherein a reference voltage is provided at a reference node that couples the first resistor (R1) to the diode-configured Nchannel device of the first stage, and the switching stage includes a Pchannel device operably coupled to the first voltage source and having a gate that is common to the first node, an Nchannel device operably coupled to the second voltage source, and having a gate that is common to the reference node, wherein the switching stage is configured to couple the capacitor to the P-channel device of the switching stage to increase the voltage on the capacitor, and couple the capacitor to the Nchannel device of the switching stage to decrease the voltage on the capacitor.

13. The oscillator of claim 12, wherein the switching stage includes: a first comparator that is configured to compare the voltage on the capacitor to the first voltage level, a second comparator that is configured to compare the voltage on the capacitor to the second voltage level, and a bistable device that is configured to control the coupling of the capacitor to the Pchannel device and Nchannel device of the switching stage, based on an output of the first comparator and an output of the second comparator.

14. The oscillator of claim 10, wherein a reference voltage is provided at a reference node that couples the first resistor (R1) to the diode-configured Nchannel device of the first stage, and the switching stage includes a Pchannel device operably coupled to the first voltage source and having a gate that is common to the first node, an Nchannel device operably coupled to the second voltage source, and having a gate that is common to the reference node, wherein the switching stage is configured to couple the capacitor to the P-channel device of the switching stage to increase the voltage on the capacitor, and couple the capacitor to the Nchannel device of the switching stage to decrease the voltage on the capacitor.

15. The oscillator of claim 14, wherein the switching stage includes: a first comparator that is configured to compare the voltage on the capacitor to the first voltage level, a second comparator that is configured to compare the voltage on the capacitor to the second voltage level, and a bistable device that is configured to control the coupling of the capacitor to the Pchannel device and Nchannel device of the switching stage, based on an output of the first comparator and an output of the second comparator.

16. The oscillator of claim 10, wherein the switching stage includes: a first comparator that is configured to compare the voltage on the capacitor to the first voltage level, a second comparator that is configured to compare the voltage on the capacitor to the second voltage level, and a bistable device that is configured to control a direction of current applied to the capacitor to increase or decrease the voltage on the capacitor, bused on an output of the first comparator and an output of the second comparator.

17. The oscillator of claim 10, wherein the first resistor (R1) is formed as a Ppoly resistor, and the second resistor (R2) is formed as an Nwell resistor.

18. The oscillator of claim 1, further including a comparator circuit to compare a voltage across the first resistor with a voltage across the capacitor and to compare a voltage across the second resistor with the voltage across the capacitor to reduce variation in the oscillation frequency with temperature.

* * * * *